（12） United States Patent
Ha et al.

(10) Patent No.: US 7,825,589 B2
(45) Date of Patent: Nov. 2, 2010

(54) DISPLAY DEVICE AND MANUFACTURING METHOD OF THE SAME

(75) Inventors: Jae-kook Ha, Yongin-si (KR); Soon-wook Cha, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 675 days.

(21) Appl. No.: 11/623,604

(22) Filed: Jan. 16, 2007

(65) Prior Publication Data
US 2007/0164667 A1    Jul. 19, 2007

(30) Foreign Application Priority Data
Jan. 16, 2006    (KR)    ............. 10-2006-0004548

(51) Int. Cl.
*H01J 1/62*    (2006.01)
*H01J 63/04*    (2006.01)

(52) U.S. Cl. .................. 313/506; 313/504; 445/24

(58) Field of Classification Search ............ 313/504, 313/506; 427/66; 257/98; 438/99; 96/108; 445/24
See application file for complete search history.

(56) References Cited

U.S. PATENT DOCUMENTS

| | | | |
|---|---|---|---|
| 6,905,907 B2 * | 6/2005 | Konuma | 438/99 |
| 7,012,280 B2 * | 3/2006 | Kim et al. | 257/98 |
| 7,449,833 B2 * | 11/2008 | Kobayashi | 313/506 |
| 7,633,218 B2 * | 12/2009 | Cok | 313/503 |
| 2002/0182441 A1 * | 12/2002 | Lamansky et al. | 428/690 |
| 2004/0017152 A1 * | 1/2004 | Hashimoto et al. | 313/505 |
| 2004/0027061 A1 * | 2/2004 | Seo et al. | 313/504 |
| 2004/0124766 A1 * | 7/2004 | Nakagawa et al. | 313/504 |
| 2004/0183436 A1 * | 9/2004 | Ito et al. | 313/506 |
| 2005/0023974 A1 * | 2/2005 | Chwang et al. | 313/512 |
| 2005/0057150 A1 * | 3/2005 | Kim et al. | 313/504 |
| 2005/0093436 A1 * | 5/2005 | Yamazaki | 313/504 |
| 2005/0095460 A1 * | 5/2005 | Kim et al. | 428/690 |
| 2005/0158580 A1 * | 7/2005 | Ito et al. | 428/690 |
| 2005/0264182 A1 * | 12/2005 | Seki | 313/503 |
| 2005/0285508 A1 * | 12/2005 | Murayama et al. | 313/503 |
| 2005/0285509 A1 * | 12/2005 | Funamoto et al. | 313/504 |
| 2006/0060086 A1 * | 3/2006 | Wang et al. | 96/108 |

(Continued)

FOREIGN PATENT DOCUMENTS

JP    10153967    6/1998

(Continued)

OTHER PUBLICATIONS

Korean Intellectual Property Office Notice of Official Action for Patent Application No. 10-2006-0004548; Date of Mailing Dec. 11, 2006 (English Translation).

*Primary Examiner*—Peter J Macchiarolo
*Assistant Examiner*—Glenn Zimmerman
(74) *Attorney, Agent, or Firm*—Cantor Colburn LLP

(57) ABSTRACT

A display device includes a thin film transistor formed on an insulating substrate; a first electrode electrically connected to the thin film transistor; a conductive polymer layer formed on the first electrode; a low molecular weight organic layer formed on the conductive polymer layer; a polymer light emitting layer formed on the low molecular weight organic layer; and a second electrode formed on the light emitting layer. With this configuration, a display device, which is capable of reducing pixel defects, can be provided.

21 Claims, 12 Drawing Sheets

U.S. PATENT DOCUMENTS

2006/0220541 A1* 10/2006 Koyama .................. 313/506
2009/0206326 A1* 8/2009 Grushin et al. ............. 257/40

FOREIGN PATENT DOCUMENTS

| JP | 2001-076874 | 3/2001 |
| JP | 2003-007463 | 1/2003 |
| JP | 2005-235783 | 9/2005 |
| KR | 1020040002804 | 1/2004 |
| KR | 1020040094078 | 11/2004 |
| KR | 1020050011710 | 1/2005 |

* cited by examiner

DISPLAY DEVICE AND MANUFACTURING METHOD OF THE SAME

This application claims priority to Korean Patent Application No. 2006-0004548, filed on Jan. 16, 2006, and all the benefits accruing therefrom under 35 U.S.C. §119, the contents of which in its entirety are herein incorporated by reference.

BACKGROUND OF THE INVENTION (a) Field of the Invention

The present invention relates to a display device and a manufacturing method of the same, and more particularly, to a display device, which is capable of reducing pixel defects by alternately forming polymer organic layers and low molecular weight organic layers, and a manufacturing method of the same.

(b) Description of the Related Art

Among flat panel displays, organic light emitting diodes ("OLEDs") have been recently spotlighted because of their low voltage driving, light weight, thinness, wide viewing angle and high speed response, for example. An OLED is categorized as either a passive matrix type and an active matrix type. The passive matrix type OLED has disadvantages including rapid increase of power consumption with larger display areas and higher resolution, although it has a relatively simple manufacturing process. For this reason, the passive matrix type OLED is mainly applied to a small-sized display devices. In contrast, the active matrix type OLED has a merit of a large screen size and a high resolution although it has a relatively complicated manufacturing process.

The active matrix type OLED controls light emission of a light emitting layer for each pixel region to which a transistor is connected. A pixel electrode is provided in each pixel region and each pixel electrode is electrically isolated from adjacent pixel electrodes for independent driving thereof. Organic layers including a light emitting layer are sequentially formed on the pixel electrodes. A common electrode is formed on the light emitting layer.

The organic layers in the OLED are formed by a wet method or a dry method. The wet method is used to form a polymer organic layer, including an inkjet method, a spin coating method, a spray coating method, a roll-to-roll method, a nozzle coating method, etc. The dry method is used to form a low molecular weight organic layer, primarily including an evaporation method.

However, although the wet method is adapted to fabricating a large OLED and has a merit of less material consumption, it also has a problem of pixel defects since an organic layer does not entirely cover a pixel electrode.

BRIEF SUMMARY OF THE INVENTION

Accordingly, it is an aspect of the present invention to provide a display device with reduced pixel defects.

It is another aspect of the present invention to provide a manufacturing method of a display device with reduced pixel defects.

The foregoing and/or other aspects, features and advantages of the present invention can be achieved by providing an exemplary embodiment of a display device including: a thin film transistor formed on an insulating substrate; a first electrode electrically connected to the thin film transistor; a conductive polymer layer formed on the first electrode; a first low molecular weight organic layer formed on the conductive polymer layer; a light emitting layer formed on the first low molecular weight organic layer; and a second electrode formed on the polymer light emitting layer.

In exemplary embodiments, the light emitting layer comprises polymer.

In exemplary embodiments, the display device further includes an second low molecular weight organic layer formed between the light emitting layer and the second electrode.

In exemplary embodiments, the display device further includes a barrier surrounding the conductive polymer layer and the light emitting layer, and at least one of the conductive polymer layer and the polymer light emitting layer is formed by an inkjet method.

In exemplary embodiments, at least one of the first low molecular weight organic layer and the second low molecular weight organic layer is formed by a thermal evaporation method.

In exemplary embodiments, the first low molecular weight organic layer and the second low molecular weight organic layer are formed over the entire surface of the insulating substrate.

In exemplary embodiments, the conductive polymer layer includes poly(3,4-ethylenedioxythiophene) and polystyrene sulfonic acid.

In exemplary embodiments, the conductive polymer layer includes polyaniline.

In exemplary embodiments, the first low molecular weight organic layer includes a hole injecting layer and a hole transporting layer.

In exemplary embodiments, the second low molecular weight organic layer includes an electron transporting layer.

In exemplary embodiments, the first electrode includes one of indium tin oxide and indium zinc oxide.

In exemplary embodiments, the maximum surface unevenness of the conductive polymer layer is less than the maximum surface unevenness of the first electrode.

In exemplary embodiments, the second electrode includes LiF and Al.

The foregoing and/or other aspects, features and advantages of the present invention can be also achieved by providing an exemplary embodiment of a method of manufacturing a display device, the method includes: forming a thin film transistor on an insulating substrate; forming a first electrode electrically connected to the thin film transistor; forming a conductive polymer layer on the first electrode; forming a first low molecular weight organic layer on the conductive polymer layer; forming a light emitting layer on the first low molecular weight organic layer; and forming a second electrode on the polymer light emitting layer.

In exemplary embodiments, the light emitting layer comprises polymer. In exemplary embodiments, the method further includes forming an second low molecular weight organic layer between the light emitting layer and the second electrode.

In exemplary embodiments, the method further includes forming at least one of the conductive polymer layer and the light emitting layer by an inkjet method.

In exemplary embodiments, the method further includes forming at least one of the first low molecular weight organic layer and the second low molecular weight organic layer by a thermal evaporation method.

In exemplary embodiments, the method further includes forming the first low molecular weight organic layer and the second low molecular weight organic layer over the entire surface of the insulating substrate.

In exemplary embodiments, the conductive polymer layer comprises poly(3,4-ethylenedioxythiophene) and polystyrene sulfonic acid.

In exemplary embodiments, the first low molecular weight organic layer includes a hole injecting layer and a hole transporting layer, and the second low molecular weight organic layer includes an electron transporting layer.

BRIEF DESCRIPTION OF THE DRAWINGS

The above and/or other aspects, features and advantages of the present invention will become apparent and more readily appreciated from the following description of the exemplary embodiments, taken in conjunction with the accompanying drawings of which.

DETAILED DESCRIPTION OF THE INVENTION

Figure 1:
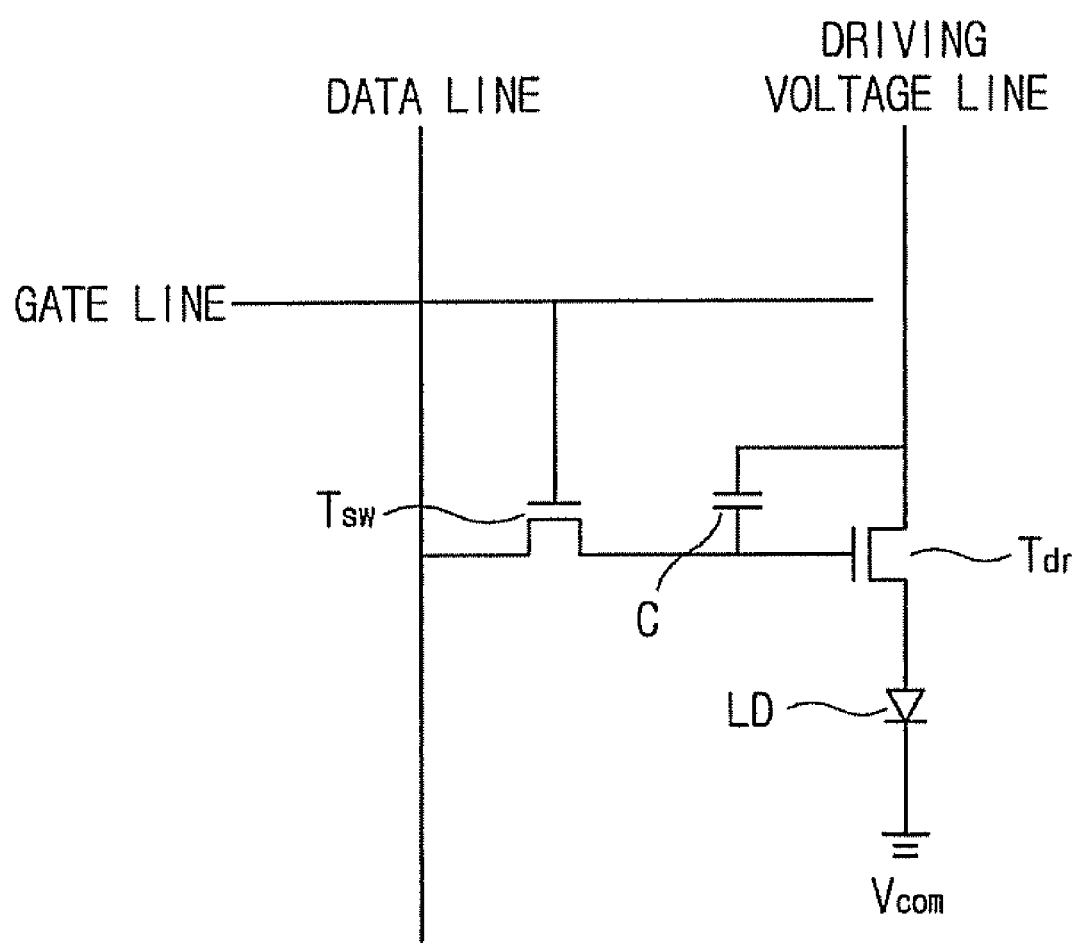
FIG. 1 is an equivalent circuit schematic diagram of a display device according to an exemplary embodiment of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Reference will now be made in more detail to exemplary embodiments of the present invention, examples of which are illustrated in the accompanying drawings.

Referring to FIG. 1, a plurality of signal lines are provided in one pixel. The signal lines include a gate line for transmitting a scan signal, a data line for transmitting a data signal and a driving voltage line for transmitting a driving voltage. The data line and the driving voltage line are adjacent in parallel to each other, and the gate line extends perpendicular to the data line and the driving voltage line.

Each pixel includes an organic light emitting device LD, a switching thin film transistor ("TFT") Tsw, a driving TFT Tdr and a capacitor C.

The driving TFT Tdr has a control terminal connected to the switching TFT Tsw, an input terminal connected to the driving voltage line, and an output terminal connected to the organic light emitting device LD.

The organic light emitting element LD has an anode connected to the output terminal of the driving TFT Tdr and a cathode connected to a common voltage line Vcom. For display of an image, the organic light emitting device LD emits light having an intensity which varies depending on the intensity of output current of the driving TFT Tdr. The magnitude of the output current of the driving TFT Tdr varies depending on the magnitude of a voltage applied between the control terminal and the output terminal of the driving TFT Tdr.

The switching TFT Tsw has a control terminal connected to the gate line, an input terminal connected to the data line, and an output terminal connected to the control terminal of the driving TFT Tdr. The switching TFT Tsw transmits the data signal applied to the data line to the driving TFT Tdr according to the scan signal applied to the gate line.

The capacitor C is connected between the control terminal and the input terminal of the driving TFT Tdr. The capacitor C is charged with and holds the data signal input to the control terminal of the driving TFT Tdr.

Figure 2A:
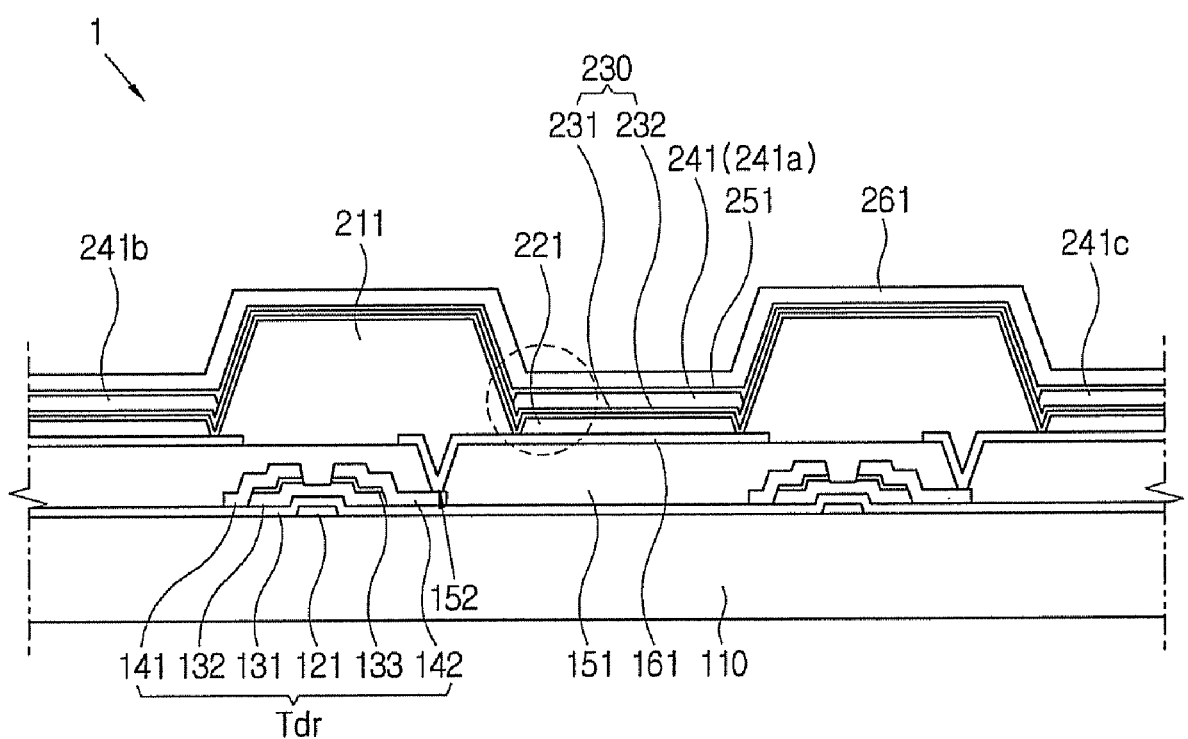
FIG. 2A is a cross-sectional view of the display device according to an exemplary embodiment of the present invention.
Figure 2B:
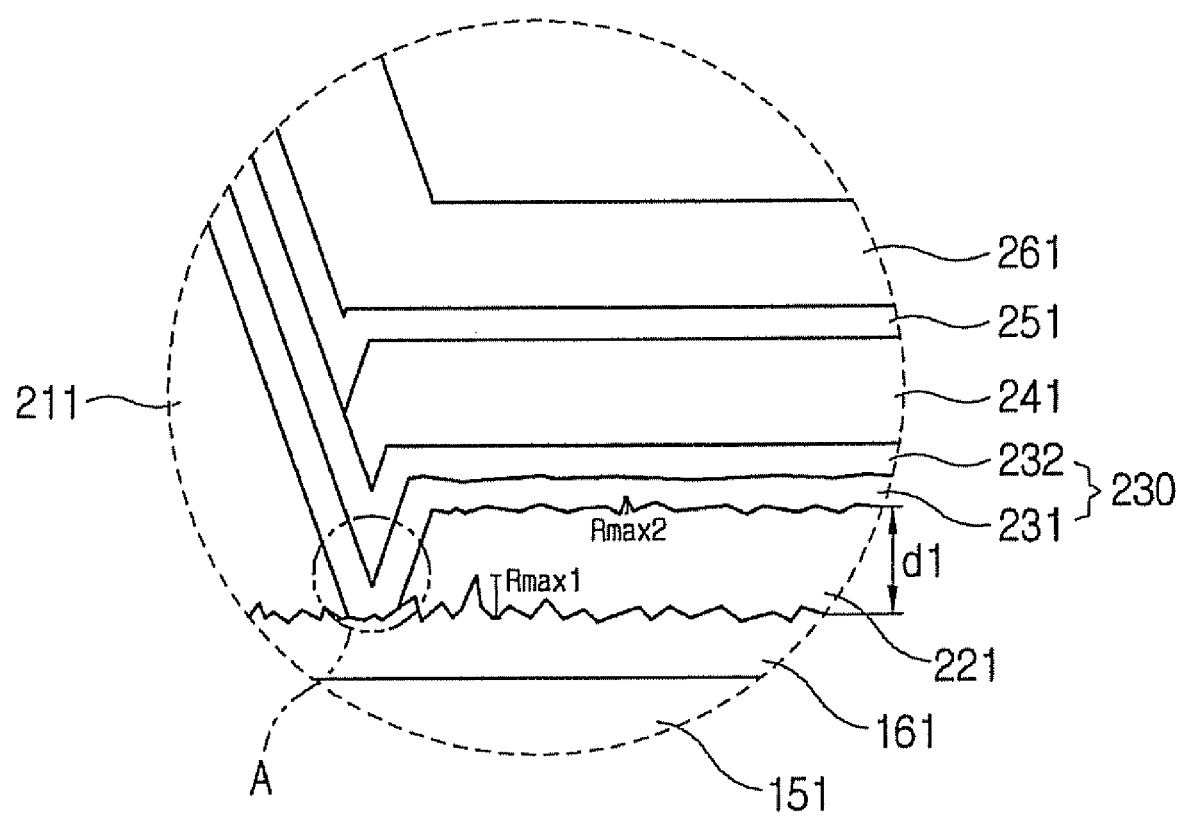
FIG. 2B is an enlarged cross-sectional view of a circled portion in phantom lines of FIG. 2A.

Hereinafter, a display device 1 according to an exemplary embodiment of the present invention will be described in more detail with reference to FIGS. 2A and 2B. FIG. 2A shows the driving TFT Tdr alone. FIG. 2b is an enlarged cross-sectional view of a circled portion shown with phantom lines in FIG. 2A.

A gate electrode 121 is formed on an insulating substrate 110, which is made of insulating material such as glass, quartz, ceramic, or plastic, for example.

A gate insulating layer 131 made of silicon nitride ("SiNx") or the like is formed on the insulating substrate 110 and the gate electrode 121.

A semiconductor layer 132 made of amorphous silicon and an ohmic contact layer 133 made of n+ hydrogenated amorphous silicon with heavily-doped n type impurities are sequentially formed on a portion of the gate insulating layer 131 where the gate electrode 121 is located. Here, the ohmic contact layer 133 is divided into two portions with respect to the gate electrode 121.

A source electrode 141 and a drain electrode 142 are formed on the ohmic contact layer 133 and the gate insulating layer 131. The source electrode 141 and the drain electrode 142 are separated from each other with respect to the gate electrode 121.

A passivation layer 151 is formed on the source electrode 141, the drain electrode 142, and an exposed portion of the semiconductor layer 132, which is not covered by electrodes 141 and 142. The passivation layer 151 may be made of an inorganic material such as silicon nitride ("SiNx") or an organic material, or may have a two-layered structure of an inorganic layer and an organic layer. The organic layer may comprise any one of benzocyclobutene ("BCB") series, olefin series, acryl resin series, polyimide series, and fluoropolymer such as perfluorocyclobutane ("FCB").

A contact hole 152 to expose the drain electrode 142 is formed in the passivation layer 151 by removing some of an upper portion of the drain electrode 142.

A first electrode 161 is formed on the passivation layer 151. The first electrode 161 provides holes to a polymer light emitting layer 241. The first electrode 161 is made of a transparent conductive material such as indium tin oxide ("ITO") or indium zinc oxide ("IZO") and is connected to the drain electrode 142 via the contact hole 152.

The first electrode 161 may be formed by a sputtering method and may have a very uneven surface with the maximum unevenness (Rmax1) of about 1000 Å, which is a difference between the lowest portion and the highest portion of the first electrode 161. The first electrode 161 may have a pattern of substantially a rectangular shape when viewed from above.

A barrier 211 which surrounds the first electrode 161 is formed on the first electrode 161 and the passivation layer 151. The barrier 211 may be made of a photosensitive material with heat resistance and solvent resistance, such as acryl resin, polyimide resin or the like, or an inorganic material such as $SiO_2$, $TiO_2$ or the like, and may have a two-layered structure of an organic layer and an inorganic layer.

A conductive polymer layer 221 is formed on the first electrode 161. The conductive polymer layer 221 may be made of poly(3,4-ethylenedioxythiophene) ("PEDOT"), polystyrene sulfonic acid ("PSS"), polyaniline, or the like. The conductive polymer layer 221 may be formed by an inkjet method in a liquefied suspension state where the above-mentioned polymers are mixed with water.

The conductive polymer layer 221 covers most of the first electrode 161, but is not formed in a circled portion A (FIG. 2B) adjacent to the barrier 211. Before the conductive polymer layer 221 is formed, the first electrode 161 is treated to have a hydrophilic property and the barrier 211 is treated to have a hydrophobic property. Since ink used to form the conductive polymer layer 221 is in an aqueous solution state, it is uniformly distributed on the first electrode 161 with the hydrophilic property without contacting the barrier 211 with the hydrophobic property.

If the first electrode 161 is not properly treated to have a hydrophilic property and the barrier 211 is not properly treated to have a hydrophobic property, the conductive polymer layer 221 is not formed on a portion of the first electrode 161 around the barrier 211, which is called "dewet." The dewet results in nonuniform properties of the pixels and may cause defects such as short circuiting of the first electrode 161 and a second electrode 261.

The conductive polymer layer 221 has a relatively small surface unevenness with the maximum unevenness (Rmax2) of less than about 100 Å and the mean unevenness (Ra) of less than about 10 Å. More specifically, the maximum unevenness (Rmax2) may be about 10 Å to about 100 Å and the mean unevenness (Ra) may be about 1 Å to about 10 Å. That is, the conductive polymer layer 221 plays a role in alleviating the unevenness of the first electrode 161.

Due to the nonuniform thickness of the first electrode 161, a thin film, particularly the polymer light emitting layer 241, formed on the first electrode 161 may partially have a small thickness. When the display device is driven, the polymer light emitting layer 241 may be broken due to an electric field concentrated on this thin portion. The broken polymer light emitting layer 241 may be provided as a path of leakage current, thereby causing pixel defects such as a dark spot, a dark pixel and the like.

The conductive polymer layer 221 reduces such pixel defects by alleviating the nonuniform thickness of the first electrode 161.

A thickness d1 of the conductive polymer layer 221 covering the first electrode 161 may be about 1.2 times to about 10 times the maximum unevenness (Rmax1) of the first electrode 161, that is, 1200 Å to 10,000 Å. If the thickness d1 of the conductive polymer layer 221 on the first electrode 161 is less than 1200 Å, the unevenness of the first electrode 161 may not be alleviated. If the thickness d1 of the conductive polymer layer 221 is more than 10,000 Å, resistance of the conductive polymer layer 221 increases greatly, thereby lowering its light transmittance.

A lower low molecular weight organic layer 230 is formed on the conductive polymer layer 221 and the barrier 211. The lower low molecular weight organic layer 230 comprises a hole injecting layer 231 and a hole transporting layer 232 and may be formed by a thermal evaporation method.

The lower low molecular weight organic layer 230 is formed over the entire surface of the insulating substrate 110.

In particular, the lower low molecular weight organic layer 230 is also formed on an exposed portion of the first electrode 161, which is not covered by the conductive polymer layer 221. Accordingly, the polymer light emitting layer 241 or the second electrode 261 is prevented from making direct contact with the first electrode 161.

The lower low molecular weight organic layer 230 formed on the conductive polymer layer 221 has a relatively even surface due to a relatively uniform surface of the conductive polymer layer 221.

The hole injecting layer 231 and the hole transporting layer 232 may be made of amine derivatives with strong fluorescence, for example, triphenyl diamine derivatives, styrylamine derivatives, or amine derivatives with aromatic condensation rings.

Holes emitted from the first electrode 161 are efficiently provided to the polymer light emitting layer 241 due to the lower low molecular weight organic layer 230 comprising the hole injecting layer 231 and the hole transporting layer 232.

As described above, the first electrode 161, the conductive polymer layer 221 and the lower low molecular weight organic layer 230 have a structure of electrode-conductive material-insulating material. In this structure, the holes emitted from the first electrode 161 may be smoothly provided to the polymer light emitting layer 241 using a tunneling effect.

The polymer light emitting layer 241 is formed on the lower low molecular weight organic layer 230.

The polymer light emitting layer 241, which is located between the barriers 211, comprises three sub layers 241a, 241b and 241c that emit light of different colors.

The polymer light emitting layer 241 may be formed by doping perylene coloring matter, rodermine coloring matter, rubrene, perylene, 9,10-diphenylanthracene, tetraphenylbutadiene, Nile Red, Coumarin 6, Quinacridone, etc., into polyfluorene derivatives, (poly)paraphenylvy derivatives, polyphenylene derivatives, polyvinylcarbazole, polythiophene derivatives, or a polymer material thereof. The polymer light emitting layer 241 may be formed by an inkjet method.

An upper low molecular weight organic layer 251 is formed on the polymer light emitting layer 241 and a portion of the lower low molecular weight organic layer 230 on which the polymer light emitting layer 241 is not formed. The upper low molecular weight organic layer 251 is formed over the entire surface of the insulating substrate 110 by a thermal evaporation method.

The upper low molecular weight organic layer 251 may be made of an electron transporting material such as quinoline derivatives, particularly, aluminum tris(8-hydroxyquinoline) ("Alq3"), or phenyl anthracene derivatives or tetraarylethene derivatives.

The second electrode 261 is formed on the upper low molecular weight organic layer 251. The second electrode 261 is a common electrode which applies a common voltage to all pixels. The second electrode 261 is formed throughout the insulating substrate 110 and may be a LiF/Al double layer.

Electrons emitted from the second electrode 261 are efficiently provided to the polymer light emitting layer 241 due to the upper low molecular weight organic layer 251 comprising an electron injecting material.

As described above, the Al layer and LiF layer of the second electrode 261, and the upper low molecular weight organic layer 251 have a structure of electrode-conductive material-insulating material. In this structure, the electrons emitted from the Al layer of the second electrode 261 may be smoothly provided to the polymer light emitting layer 241 using a tunneling effect.

The holes emitted from the first electrode 161 and the electrons emitted from the second electrode 261 are combined into exitons in the polymer light emitting layer 241. The exitons generate light in an inactivation process.

As described above, in the display device according to an exemplary embodiment of the present invention, the surface unevenness of the first electrode 161 is alleviated by the conductive polymer layer 221 formed by the inkjet method, thereby reducing pixel defects, and the lower low molecular weight organic layer 230 can prevent the first electrode 161 from making direct contact with the polymer light emitting layer 241. In addition, the electrons and the holes are smoothly provided to the polymer light emitting layer 241 by the lower low molecular weight organic layer 230 and the upper low molecular weight organic layer 251.

The lower low molecular weight organic layer 230 and the upper low molecular weight organic layer 251 are formed over the entire surface of the insulating substrate 110, thereby requiring no separate shadow mask or no patterning process.

FIGS. 3 to 9B illustrate a manufacturing method of a display device according to an exemplary embodiment of the present invention.

Figure 3:
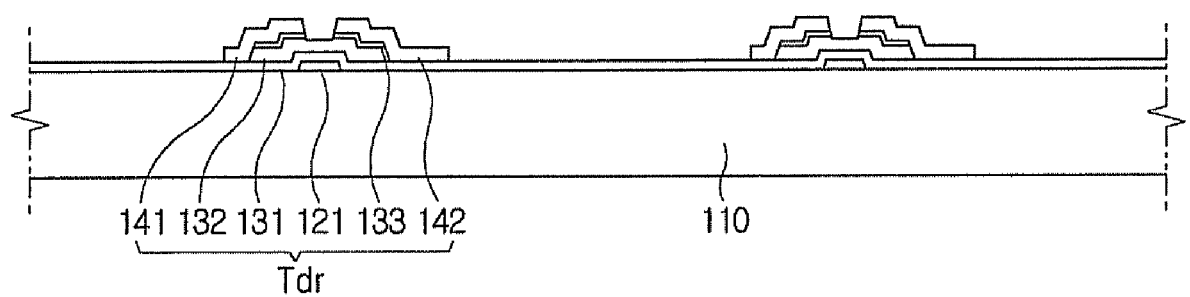
FIGS. 3 to 9B are partial cross-sectional views illustrating a manufacturing method of the display device of FIG. 2A according to an exemplary embodiment of the present invention.

First, as shown in FIG. 3, the TFT Tdr is formed on the insulating substrate 110. The TFT Tdr has a channel region made of amorphous silicon and may be fabricated by a known method.

Figure 4:
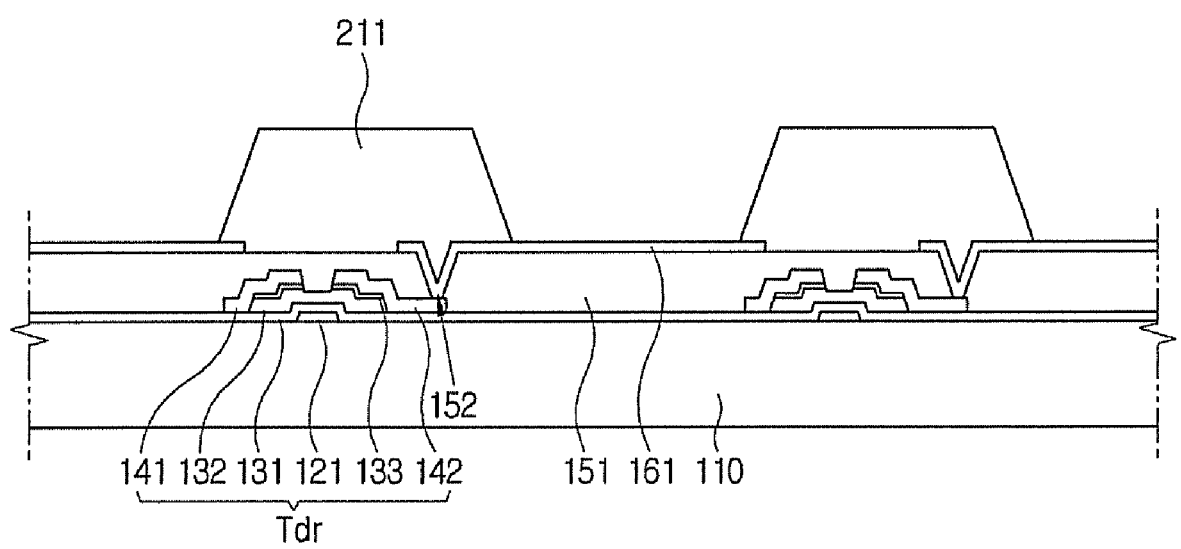

Next, as shown in FIG. 4, the passivation layer 151, the first electrode 161 and the barriers 211 are formed on the TFT Tdr. If the passivation layer 151 comprises a silicon nitride layer, it may be formed by a chemical vapor deposition ("CVD") method. If the passivation layer comprises an organic layer, it may be formed by a slit coating method or a spin coating method and the contact hole 152 is formed in the passivation layer 151 by exposure and development processes. The first electrode 161 is formed by forming a transparent conductive layer such as ITO or IZO using a sputtering method and patterning the formed conductive layer using a photolithographic method. The barriers 211 may be formed by applying a photosensitive material layer and exposing and developing the applied photosensitive material layer.

After completing the barriers 211, surfaces of the first electrode 161 and the barriers 211 are subjected to plasma treatment. In the surface treatment, the first electrode 161 has a hydrophilic property by oxygen ($O_2$) plasma treatment and the barrier 211 has a hydrophobic property by CF4 plasma treatment. The $O_2$ plasma treatment and the CF4 plasma treatment are conducted for both the barrier 211 and the first electrode 161. Since variation of a surface property of the barrier 211 is insignificant in the $O_2$ plasma treatment and variation of a surface property of the first electrode 161 is insignificant in the CF4 plasma treatment, the first electrode 161 and the barrier 211 may have different surface properties.

Figure 5:
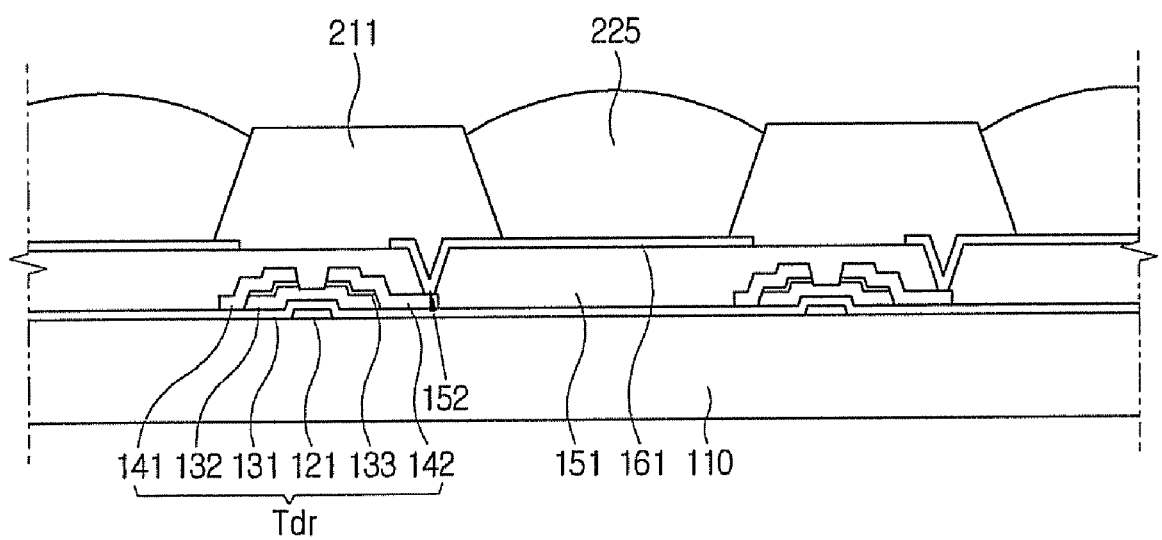

FIG. 5 shows a state in which a polymer conductive solution 225 comprising hole injecting material is dropped on the first electrode 161 between one barrier 211 and an adjacent barrier 211 using an inkjet method. The polymer conductive solution 225 is formed over the entire surface of the first electrode 161.

The polymer conductive solution 225 may be an aqueous solution of polythiophene derivatives, such as poly(3,4-ethylendioxythiophene) ("PEDOT") and polystyrene sulfonic acid ("PSS"). The polymer conductive solution 225 dropped between the barriers 211 slips off the barriers 211 due to the hydrophobic property of the barriers 211 so that the polymer conductive solution 225 is placed on the first electrode 161.

Thereafter, the polymer conductive solution 225 is dried at room temperature and a pressure of 1 Torr under a nitrogen atmosphere. If the pressure is too low, there is a danger that the polymer conductive solution 225 will boil suddenly. If the drying temperature exceeds room temperature, an evaporation speed of a solvent increases, which results in difficulty in forming a film having uniform thickness.

Figure 6A:
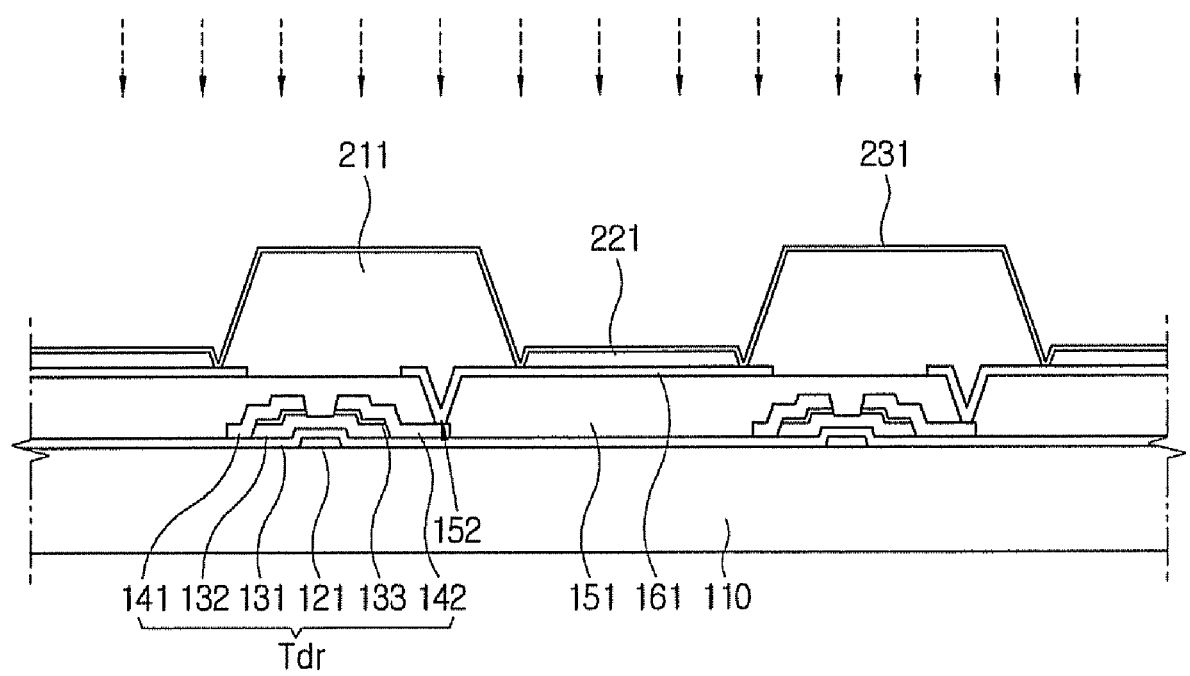

Thereafter, as shown in FIG. 6A, the hole injecting layer 231 is formed on the conductive polymer layer 221 and the barriers 211 using a thermal evaporation method.

The conductive polymer layer 221 is isolated from the barriers 211 at a portion adjacent to each barrier 211, as indicated by circle portion A in FIG. 2B, to expose the first electrode 161. The reason why the conductive polymer layer 221 does not cover the entire surface of the first electrode 161 is that plasma treatment is insufficient or jetting time is long.

The hole injecting layer 231 is formed on the entire surface of the insulating substrate 110, and hence, on the exposed portion of the first electrode 161.

Figure 6B:
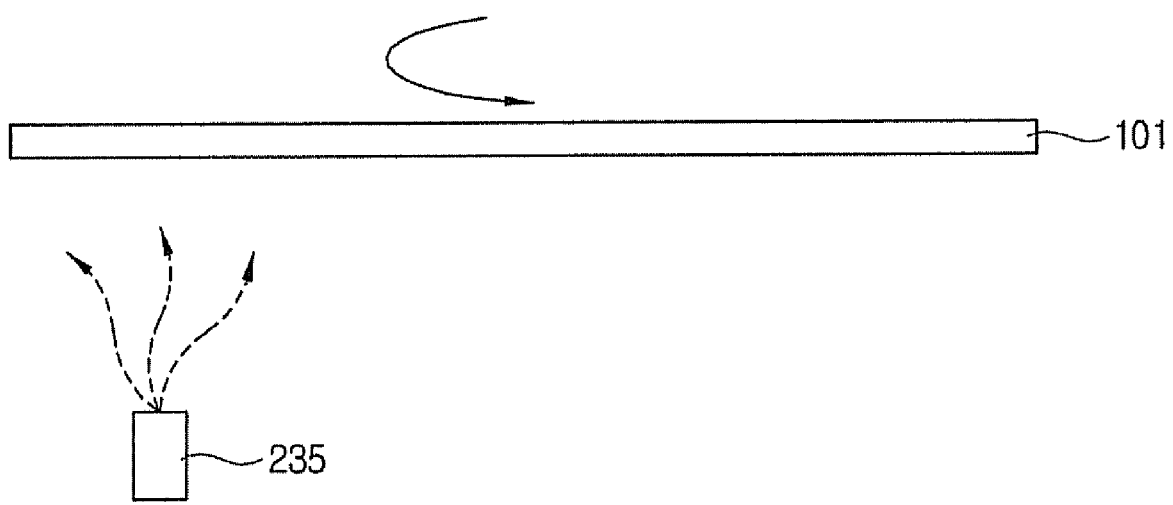

FIG. 6b shows a state in which the hole injecting layer 231 is formed.

A deposition-object substrate 101 on which the conductive polymer layer 221 is formed is arranged in such a manner that the conductive polymer layer 221 is directed downward. Since ink jetting for formation of the conductive polymer layer 221 is conducted in a state in which the barrier 211s are directed upward, the deposition-object substrate 101 is rotated by 180 degrees for formation of the hole injecting layer 231.

A hole injecting material source 235 in which hole injecting material is contained is arranged below the deposition-object substrate 101. Vapor generated by heating the hole injecting material is supplied to the deposition-object substrate 101. The supplied vapor is solidified while it decreases in temperature when contacting the deposition-object substrate 101, thereby forming the hole injecting layer 231.

The hole injecting layer 231 can be formed without a separate shadow mask between the deposition-object substrate 101 and the hole injecting material source 235. Since the shadow mask is not used, the hole injecting layer 231 may be formed over the entire surface of the insulating substrate 110.

Figure 7:
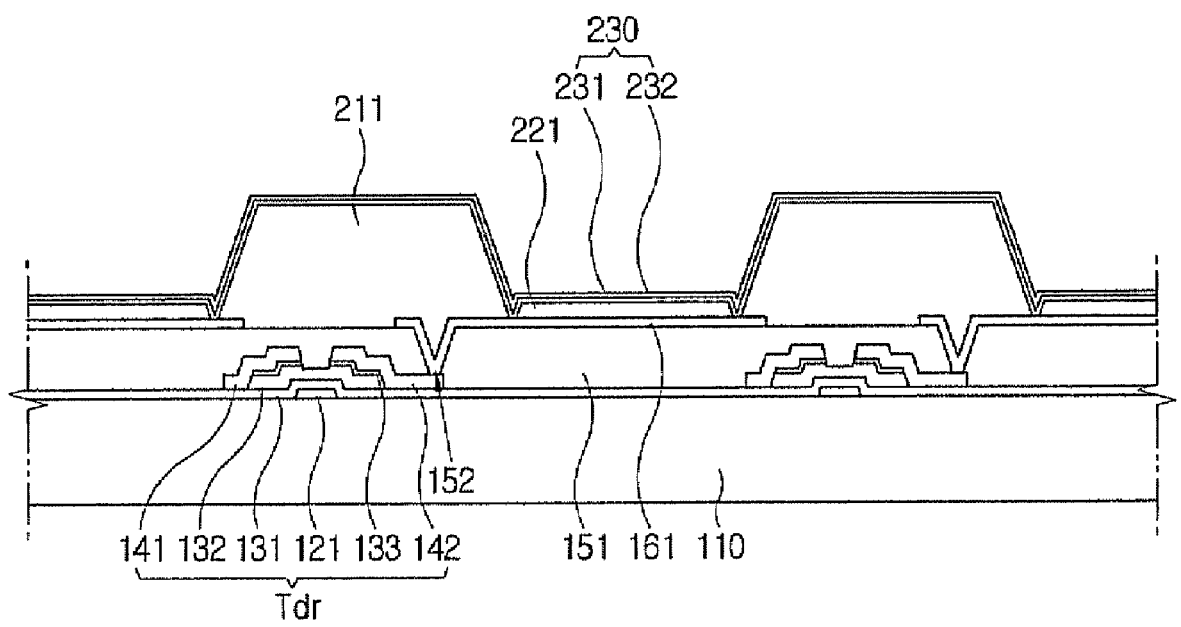

Thereafter, as shown in FIG. 7, the lower low molecular weight organic layer 230 is completed by forming the hole transporting layer 232 on the hole injecting layer 231. The hole transporting layer 232 is formed by a thermal evaporation method without using a shadow mask like the hole injecting layer 231.

Figure 8:
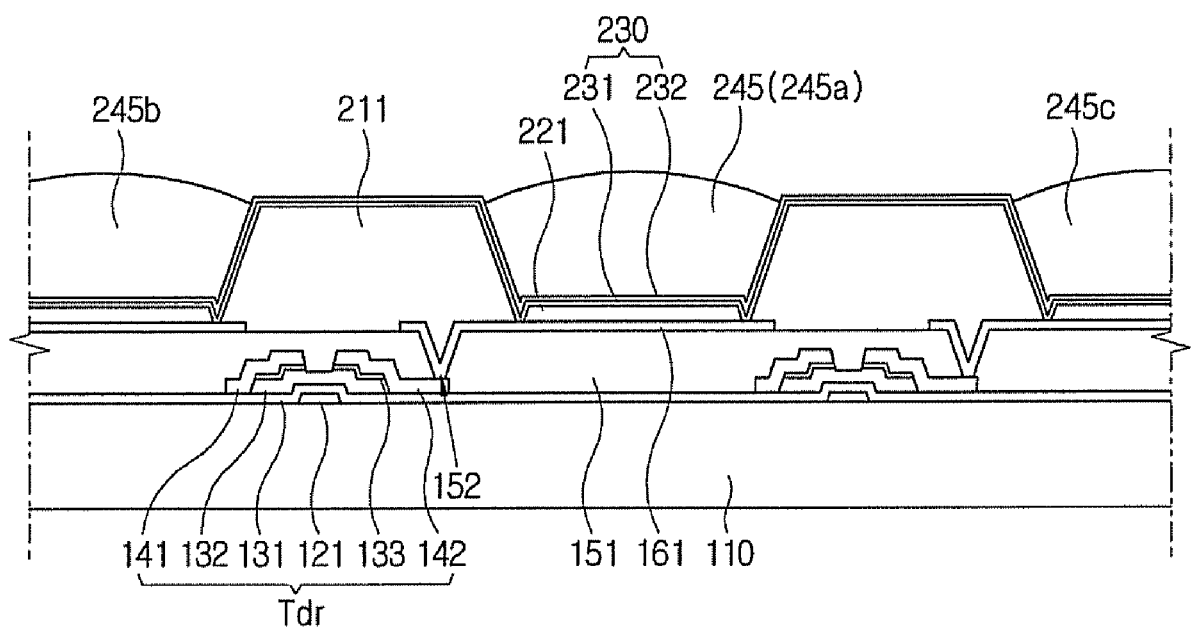

Thereafter, as shown in FIG. 8, polymer light emitting ink 245 is dropped between the barriers 211 covered by the lower low molecular weight organic layer 230. The polymer light emitting ink 245 comprises a plurality of sub inks 245a, 245b and 245c containing polymer light emitting material of different colors. For the dropping of the polymer light emitting ink 245, the insulating substrate 110 on which the lower low molecular weight organic layer 230 is formed is again rotated by 180 degrees in such a manner that the barriers 211 are directed upward, as illustrated.

When the dropped polymer light emitting ink 245 is dried, the polymer light emitting layer 241 is formed between the barriers 211.

Figure 9A:
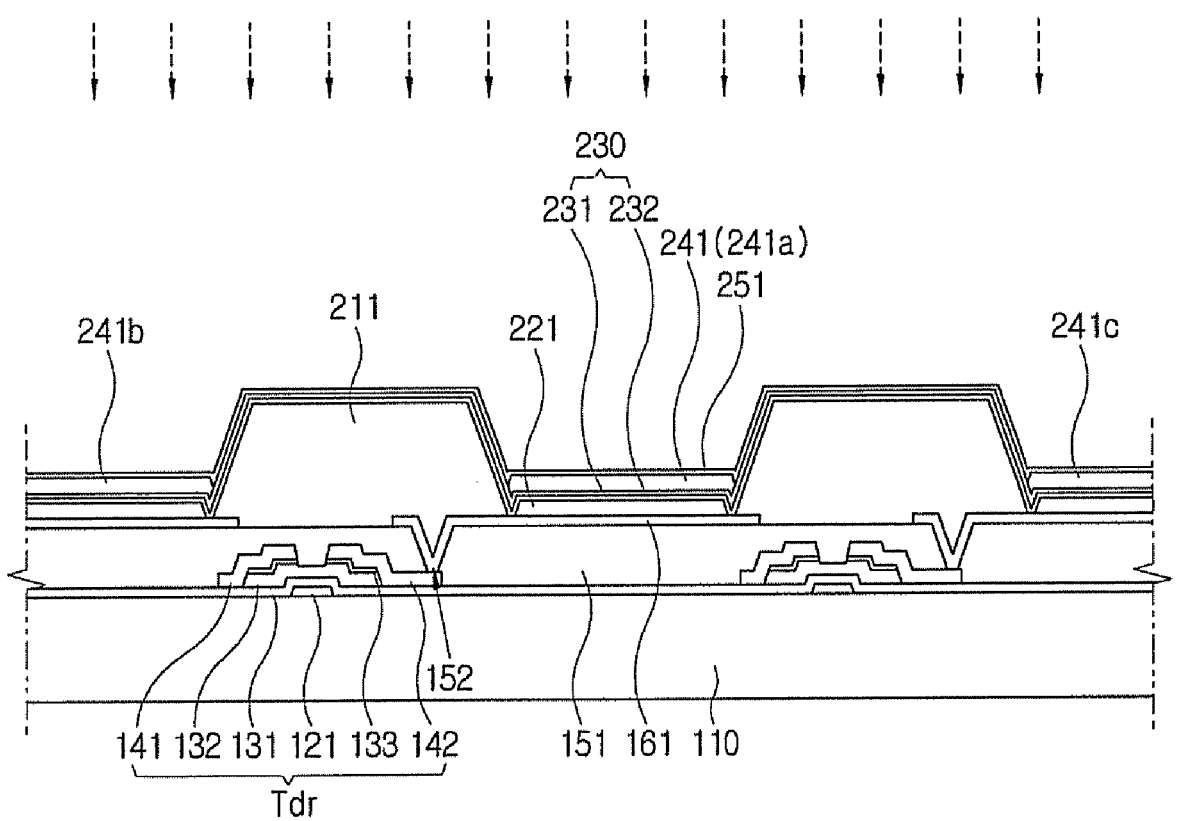

Thereafter, as shown in FIG. 9a, the upper low molecular weight organic layer 251 is formed on the polymer light emitting layer 241 and the lower low molecular weight organic layer 230 by a thermal evaporation method.

Figure 9B:
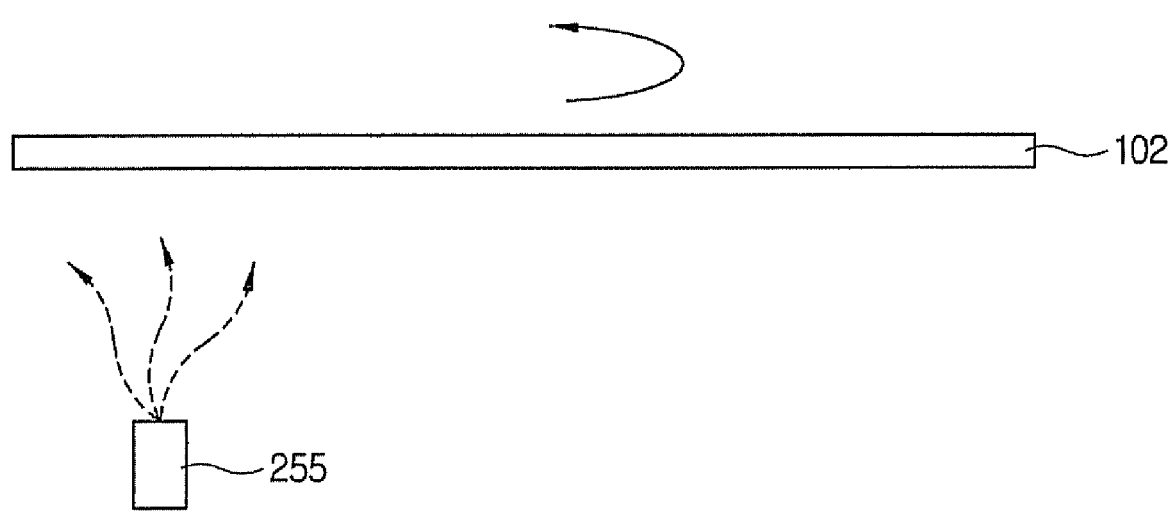

FIG. 9b shows a state in which the upper low molecular weight organic layer 251 is formed.

A deposition-object substrate 102 on which the polymer light emitting layer 241 is formed is arranged in such a manner that the polymer light emitting layer 241 is directed downward. Since ink jetting for formation of the polymer light emitting layer 241 is conducted in a state in which the barriers 211 are directed upward, the deposition-object substrate 102 is rotated by 180 degrees for formation of the upper low molecular weight organic layer 251.

An electron transporting material source 255 in which electron transporting material is contained is arranged below the deposition-object substrate 102. Vapor generated by heating the electron transporting material is supplied to the deposition-object substrate 102. The supplied vapor is solidified while it decreases in temperature when contacting the deposition-object substrate 102, thereby forming the upper low molecular weight organic layer 251.

The upper low molecular weight organic layer 251 can be formed without a separate shadow mask between the deposition-object substrate 102 and the electron transporting material source 255. Since the shadow mask is not used, the upper low molecular weight organic layer 251 may be formed over the entire surface of the insulating substrate 110.

Finally, the second electrode 261 is formed on the upper low molecular weight organic layer 251 to complete the display device 1 shown in FIG. 2A.

The second electrode 261 may be formed by sequentially forming a LiF layer and an Al layer using a sputtering method. The second electrode 261 is formed over the entire surface of the upper low molecular weight organic layer 251 in a state in which the barriers 211 are directed upward.

As apparent from the above description, exemplary embodiments of the present invention provide a display device with reduced pixel defects.

In addition, exemplary embodiments of the present invention provide a manufacturing method of a display device with reduced pixel defects.

Although a few exemplary embodiments of the present invention have been shown and described, it will be appreciated by those skilled in the art that changes may be made in these exemplary embodiments without departing from the principles and spirit of the present invention, the scope of which is defined in the appended claims and their equivalents.

What is claimed is:

1. A display device comprising:
a thin film transistor formed on an insulating substrate;
a first electrode electrically connected to the thin film transistor and having a hydrophilic property;
plurality of barriers formed on the first electrode and having a hydrophobic property, the barriers surround the first electrode;
a conductive polymer layer formed on the first electrode and disposed between the barriers;
a hole injecting layer formed on the conductive polymer layer;
a hole transporting layer formed on the hole injecting layer;
a light emitting layer formed on the hole transporting layer; and
a second electrode formed on the light emitting layer,
wherein a portion of the first electrode between the barrier and the conductive polymer layer is exposed, and
the hole injecting layer covers the exposed portion of the first electrode.

2. The display device according to claim 1, wherein the light emitting layer comprises polymer.

3. The display device according to claim 1, further comprising a low molecular weight organic layer formed between the light emitting layer and the second electrode.

4. The display device according to claim 3, wherein at least one of the conductive polymer layer and the light emitting layer is formed by an inkjet method.

5. The display device according to claim 4, wherein at least one of the hole injecting layer, the hole transporting layer, and the low molecular weight organic layer is formed by a thermal evaporation method.

6. The display device according to claim 4, wherein the hole injecting layer, the hole transporting layer, and the low molecular weight organic layer are formed over the entire surface of the insulating substrate.

7. The display device according to claim 3, wherein the conductive polymer layer comprises poly(3,4-ethylenedioxythiophene) and polystyrene sulfonic acid.

8. The display device according to claim 3, wherein the conductive polymer layer comprises polyaniline.

9. The display device according to claim 3, wherein the low molecular weight organic layer comprises an electron transporting layer.

10. The display device according to claim 1, wherein the first electrode comprises one of indium tin oxide and indium zinc oxide.

11. The display device according to claim 10, wherein the maximum surface unevenness of the conductive polymer layer is less than the maximum surface unevenness of the first electrode.

12. The display device according to claim 3, wherein the second electrode comprises LiF and Al.

13. A method of manufacturing a display device, the method comprising:
forming a thin film transistor on an insulating substrate;
forming a first electrode electrically connected to the thin film transistor;
forming a plurality of barriers on the first electrode, the barriers surround the first electrode;
performing a plasma treatment to surfaces Of the first electrode and the barriers;
forming a conductive polymer layer on the first electrode and between the barriers;
forming a hole injecting layer on the conductive polymer layer;
forming a hole transporting layer formed on the hole injecting layer;
forming a light emitting layer on the hole transporting layer; and
forming a second electrode formed on the light emitting layer,
wherein a portion of the first electrode between the harrier and the conductive polymer layer is exposed, and
the hole injecting layer covers the exposed portion of the first electrode.

14. The method according to claim 13, wherein the light emitting layer comprises polymer.

15. The method according to claim 14, further comprising forming a low molecular weight organic layer between the light emitting layer and the second electrode.

16. The method according to claim 15, wherein at least one of the conductive polymer layer and the light emitting layer is formed by an inkjet method.

17. The method according to claim 15, wherein at least one of the hole injecting layer, the hole transporting layer, and the low molecular weight organic layer is formed by a thermal evaporation method.

18. The method according to claim 17, wherein the hole injecting layer, the hole transporting layer, and the low molecular weight organic layer are formed over the entire surface of the insulating substrate.

19. The method according to claim 15, wherein the conductive polymer layer comprises poly(3,4-ethylenedioxythiophene) and polystyrene sulfonic acid.

20. The method according to claim 15, wherein the low molecular weight organic layer comprises an electron transporting layer.

21. The method according to claim 15, wherein the plasma treatment uses an oxygen plasma treatment and a CF4 plasma treatment.

* * * * *